United States Patent

Novelli

[11] Patent Number: 5,191,296
[45] Date of Patent: Mar. 2, 1993

[54] SIGNAL CONDITIONING CIRCUIT

[75] Inventor: Giorgio Novelli, Milan, Italy

[73] Assignee: Elcon Instruments S.r.l., Italy

[21] Appl. No.: 762,349

[22] Filed: Sep. 19, 1991

[30] Foreign Application Priority Data

Nov. 29, 1990 [IT] Italy .......................... 22231 A/90

[51] Int. Cl.⁵ ..................... H03F 1/02; H03G 9/902
[52] U.S. Cl. ........................................ 330/9; 330/86; 330/144
[58] Field of Search ............. 330/9, 86, 144, 261, 330/282, 284

[56] References Cited

U.S. PATENT DOCUMENTS 3,936,819  2/1976  Angelle et al. ................. 330/9 X

FOREIGN PATENT DOCUMENTS 167507  8/1985  Japan ......................... 330/261
251303  11/1986  Japan ........................ 330/282

Primary Examiner—James B. Mullins
Attorney, Agent, or Firm—Banner, Birch, McKie & Beckett

[57] ABSTRACT

A signal conditioning circuit allows for adjustment of DC offset (zero) and gain (span) by use of a number of resistors and jumpers in an Op Amp circuit. By arranging both the zero and span resistors in a trinary weighted sequence (1/3/9), only 3 resistors and 3 jumpers will be needed for +/− 130% adjustment range in 26 steps of less than 10% each. The total requirement for both the zero and span adjustment in the conditioning circuit is 6 resistors and 6 jumpers, reducing component count, printed circuit space requirements and simplifying jumper settings.

10 Claims, 2 Drawing Sheets

SIGNAL CONDITIONING CIRCUIT

CROSS-REFERENCE TO RELATED APPLICATIONS

This application is related in subject matter to application Ser. No. 770,420 filed Oct. 3, 1991 entitled "Intrinsically Safe Barrier with Integral Cross Wiring", and now U.S. Pat. No. 5,158,464.

BACKGROUND OF THE INVENTION

1. Field of the Invention

The present invention is directed to a signal conditioning circuit particularly for use with data acquisition equipment such as data loggers or other automated data acquisition equipment as well as other types of industrial controls and sensors. The signal conditioning circuit has particular application to intrinsically safe circuits used for data acquisition in hazardous environments.

More specifically, the invention relates in to an Op Amp circuit, particularly for use in signal conditioning devices. In signal conditioning circuits, it is often necessary to adjust both the offset (zero) and gain (span) of a conditioning amplifier to accommodate widely varying input sensor signal ranges from various types of sensors (i.e., thermocouple, thermopile, thermistor, platinum RTD, pressure transducer, etc.) and provide a normalized output signal such as the standard 4-20 mA current output used in process control instrumentation.

2. Description of the Prior Art

Prior art devices solved this problem in one of two ways. The first was to provide a separate conditioning amplifier circuit for each type of signal input, typically mounted on a printed circuit board "cards" which could then be interchanged with other similar "cards". This approach, of course is rather costly, as an inventory of different signal conditioning circuit cards must be kept for each type of input. An alternative to this approach is to provide a generic signal conditioning card which can be easily field modified to provide appropriate signal conditioning for a variety of inputs. The use of a generic signal conditioning circuit greatly reduces inventory costs and results in a much more flexible design, as the user need not purchase a plurality of separate signal conditioning cards for each type of input.

In order to provide such a generic signal conditioning circuit, broad offset limits (Zero) and gains (Span) must be provided to insure the circuit will function for a wide variety of inputs. Typically, the zero offset must be able to provide for an adjustment ranging from −130% to +130% of full scale and a span adjustment range of 100% to 260% of full scale with a minimum step size of 10%. The most intuitive approach to such a problem would be to provide a plurality of biasing resistors for adjusting the zero and span of the signal conditioning circuit, with a switching device to allow the appropriate resistor to be placed in the circuit. Unfortunately, in order to provide the appropriate ranges discussed above, as many as 26 resistors would be needed for each of the zero and span adjustments using such a "binary" approach.

In fact such circuits have been used that combine a plurality of resistors having a binary ohmic value sequence to enable the measuring range to be calibrated according to a two state (on/off) criterion, which is a binary system. Such circuits, however, do not ensure, within the above measuring range, appropriate values and amounts of resistors and jumpers.

More particularly, for the regulation of the so-called start scale value (Zero) and for the calibration of the gain (Span), nine resistors and ten jumpers are, for example, needed in order to have five position steps (i.e., five reference steps of the measuring range).

SUMMARY OF THE INVENTION

The total requirement therefore is 6 resistors and 6 jumpers to provide for the −130% to +130% zero adjusting range and 100% to 260% span adjusting range in 26 steps of 10% each.

Therefore, it is an object of the present invention to overcome the limits of the known art by providing a circuit device for signal calibration in industrial instrumentation reducing the amount of resistors and related connecting jumpers provided in the intended circuit. Such circuits are typically combined with circuit amplifiers for defining the measuring range and thus the present invention not make the overall circuitry larger while making it more reliable. Further, the present invention offers the possibility of industrializing the device making it adaptable to be combined with a great number of applications.

The foregoing objects, as well as others which are to become apparent from the text below, are achieved in a signal conditioning circuit by providing a series of three resistors for each of the zero and span adjustments in a trinary arrangement to provide 26 adjustment steps for each of the zero and span adjustments. In the preferred embodiment these resistors are arranged in a trinary weighted sequence in a ratio of 1:3:9. The resistors are connected to a jumper block which can connect any of the resistors into the circuit through either a $+V_{ref}$ or $-V_{ref}$ inputs.

These and other objects of the present invention will be better understood from the following detailed description of the preferred embodiment of the invention, taken in conjunction with the accompanying drawings.

DETAILED DESCRIPTION

I. Zero Adjustment

Figure 1:
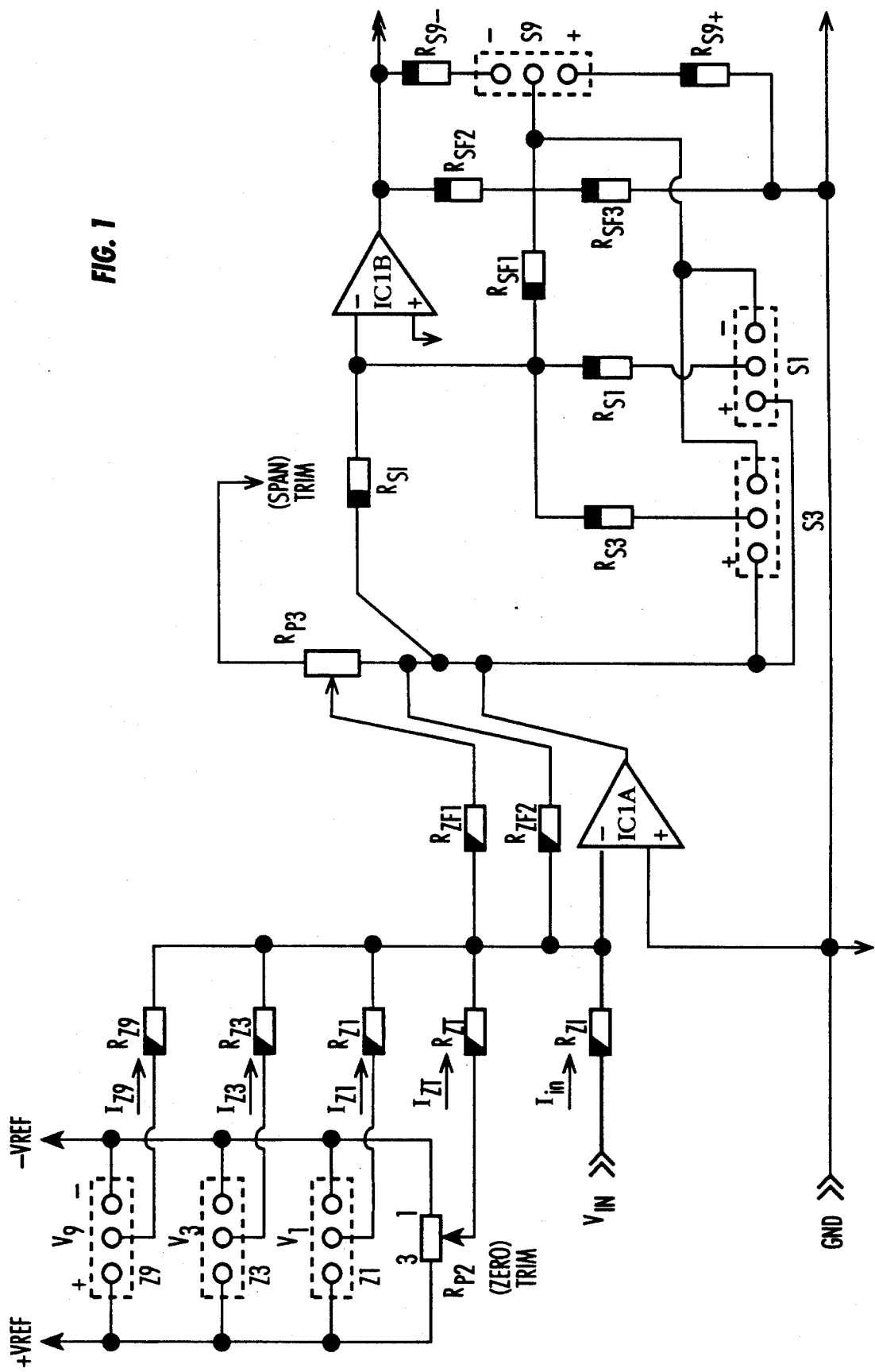
FIG. 1 shows a schematic of the signal conditioning circuit of the present invention.
Figure 2:
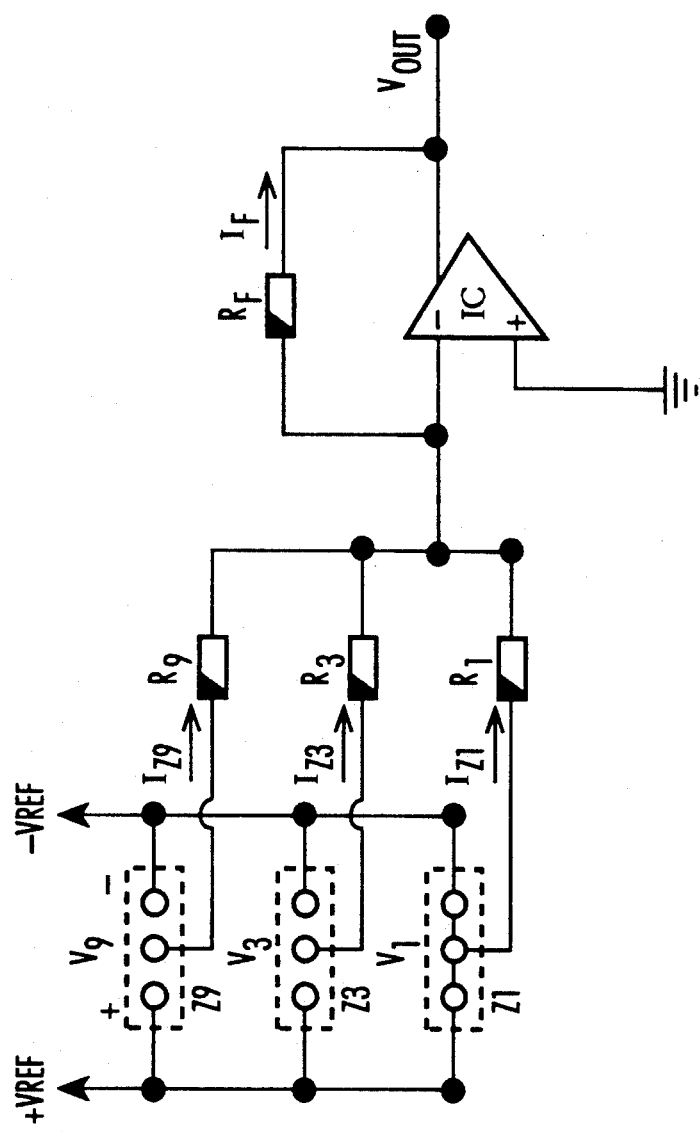
FIG. 2 shows a schematic of a simplified version of the zero offset portion of the signal conditioning circuit shown in FIG. 1.

FIG. 2 shows a simplified version of the zero span portion of the circuit shown in FIG. 1. The circuit shown in FIG. 2 is for illustrative purposes only and is used here to illustrate one of the principles behind the present invention.

As can be easily discerned, the circuit shown in FIG. 2 is that of a summing inverting amplifier. Using the ideal Op Amp design criteria, we can assume that:

$$v+ = v- = 0$$

$$I_f = -V_{out}/R_f \qquad (1)$$

Using Kirchoff's current equations, we can readily see that:

$$I_f = I_9 + I_3 + I_1 \qquad (2)$$

Substituting equations 2 into 1 yields:

$$V_{out} = -R_f(I_1 + I_3 + I_9) \quad (3).$$

As $v- = 0$, we can represent these currents as:

$$I_1 = V_1/R_1 \quad (4)$$

$$I_3 = V_3/R_3 \quad (5)$$

$$I_9 = V_9/R_9 \quad (6).$$

In a typical inverting summing amplifier circuit, resistors $R_1$, $R_3$ and $R_9$ would be set equal to R such that, substituting equations 4-6 into equation 3 yields $$V_{out} = -R_f/R(V_1 + V_3 + V_9) \quad (7)$$

with $V_{out}$ being a function of the sum of the three input voltages $V_1$, $V_3$ and $V_9$.

However, in the present invention $R_1$, $R_3$ and $R_9$ are chosen in a weighted relationship such that:

$$R_1 = R$$

$$R_3 = 3R$$

$$R_9 = 9R.$$

Hence, substituting these values into 3-6 yields the equation:

$$V_{out} = -R_f/R(V_1 + V_3/3 + V_9/9) \quad (8).$$

Now, merely for the sake of illustration, let's simplify equation 8 by assuming that $R_f$ is assigned a value nine times greater than R (i.e., $R_f = 9K$, $R = 1K$). Substituting, we yield:

$$V_{out} = -(9V_1 + 3V_3 + V_9) \quad (9).$$

As shown in FIG. 2, the values for $V_1$, $V_3$ and $V_9$ can be set to any one of three values by setting the jumpers $Z_1$, $Z_3$ or $Z_9$. In other words, voltages $V_1$, $V_3$ and $V_9$ can be either $+V_{ref}$ (+jumper), $-V_{ref}$ (−jumper) or zero (no jumper). As can be readily discerned, there is a finite number of mathematical jumper combinations for the three jumper blocks for each of three voltage levels (0, $V_{ref}$ and $-V_{ref}$). In particular, there are $3^3$ or 27 possible combinations. Table I illustrates all 27 of these combinations. In Table I, each jumper position is represented by a "+" (jumpered to $+V_{ref}$), a "−" (jumpered to $-V_{ref}$) or a "0" (no jumper). For example, looking at the first entry, we see that setting all three jumpers to the $-V_{ref}$ position and substituting into equation 8 yields will yield:

$$V_{out} = -(-9V_{ref} - 3V_{ref} - V_{ref}) \quad (9)$$
$$= +13V_{ref}$$

The remaining values in Table I are calculated in a similar manner.

TABLE I

| # | $Z_1$ | $Z_3$ | $Z_9$ | $V_{out}$ |
|---|---|---|---|---|
| 1 | − | − | − | +13 $V_{ref}$ |
| 2 | − | − | 0 | +12 $V_{ref}$ |
| 3 | − | − | + | +11 $V_{ref}$ |
| 4 | − | 0 | − | +10 $V_{ref}$ |
| 5 | − | 0 | 0 | +9 $V_{ref}$ |

TABLE I-continued

| # | $Z_1$ | $Z_3$ | $Z_9$ | $V_{out}$ |
|---|---|---|---|---|
| 6 | − | 0 | + | +8 $V_{ref}$ |
| 7 | − | + | − | +7 $V_{ref}$ |
| 8 | − | + | 0 | +6 $V_{ref}$ |
| 9 | − | + | + | +5 $V_{ref}$ |
| 10 | 0 | − | − | +4 $V_{ref}$ |
| 11 | 0 | − | 0 | +3 $V_{ref}$ |
| 12 | 0 | − | + | +2 $V_{ref}$ |
| 13 | 0 | 0 | − | +1 $V_{ref}$ |
| 14 | 0 | 0 | 0 | +0 $V_{ref}$ |
| 15 | 0 | 0 | + | −1 $V_{ref}$ |
| 16 | 0 | + | − | −2 $V_{ref}$ |
| 17 | 0 | + | 0 | −3 $V_{ref}$ |
| 18 | 0 | + | + | −4 $V_{ref}$ |
| 19 | + | − | − | −5 $V_{ref}$ |
| 20 | + | − | 0 | −6 $V_{ref}$ |
| 21 | + | − | + | −7 $V_{ref}$ |
| 22 | + | 0 | − | −8 $V_{ref}$ |
| 23 | + | 0 | 0 | −9 $V_{ref}$ |
| 24 | + | 0 | + | −10 $V_{ref}$ |
| 25 | + | + | − | −11 $V_{ref}$ |
| 26 | + | + | 0 | −12 $V_{ref}$ |
| 27 | + | + | + | −13 $V_{ref}$ |

In considering Table I, note that the use of only three resistors produces 27 different combinations of output voltages, from $-13V_{ref}$ to $+13V_{ref}$ in incremental steps of 1/27th or less than 5% for each step. All of this is accomplished with only three selected resistor values and two supply voltages. Of course, the above example is provided here only for the purpose of illustrating the underlying concept behind the present invention.

Referring back now to FIG. 1, we can see that a circuit similar to that of FIG. 2 is incorporated into the zero offset adjustment portion of the signal conditioning circuit of the present invention. As can be readily appreciated, in FIG. 1, amplifier IC1A is configured in a inverting summing amplifier configuration similar to that of FIG. 2. Input voltage $V_{IN}$ here is summed along with the voltages $V_1$, $V_3$ and $V_9$. Resistor $R_{ZI}$ is provided to scale input voltage $V_{IN}$ in relation to reference voltages $+V_{ref}$ and $-V_{ref}$. In addition to the presence of three zero offset adjustment resistors $R_{Z1}$, $R_{Z3}$ and $R_{Z9}$, zero trim pot $R_{P2}$ and zero trim resistor $R_{ZT}$ are provided to allow for fine adjustment of the zero offset of the signal conditioning circuit. The zero trim adjustment is provided in order to compensate for differences in the circuit components values which may occur due to construction tolerances, temperature changes, etc. In addition, the zero trim adjustment allows for fine adjustment of the zero offset within a range selected by the three jumpers.

Input voltage $V_{IN}$ produces a current $I_{IN}$ flowing through $R_{ZI}$ into amplifier IC1A. By assigning a unity (100%) value to the full scale input current $I_{IN}$, $R_{Z1}$ is then selected to produce (when connected to $+V_{REF}$ or $-V_{REF}$) a current $I_{Z1}$ being approximately 10% of $I_{IN}$; accordingly:

$R_{Z3}$ is dimensioned for a value of $R_{IZ3} = 30\%$ $I_{IN}$
$R_{Z9}$ is dimensioned for a value of $R_{IZ9} = 90\%$ $I_{IN}$
$R_{ZT}$ is dimensioned for a value of $R_{IZT} = 15\%$ $I_{IN}$ (Trimming).

Output of amplifier IC1A can therefore be zero shifted continuously from $+90 + 30 + 10 + 15 = +145\%$ to $-145\%$ by moving the three jumpers Z9, Z3, and Z1 and adjusting zero trimming pot $R_{P2}$.

II. Span Adjustment

Fine span adjustment is obtained in the circuit of amplifier IC1A by setting, with span trim pot $R_{P3}$, the amount of negative feedback returned at amplifier summing junction via feedback resistor $R_{ZF1}$. This in turn changes voltage gain from a max of $R_{ZF2}/R_{ZI}$ ($R_{P3}$ wiper at ground) to a minimum of $R_{ZP}/R_{ZI}$ where $R_{ZP}$ is the parallel value of $R_{ZF2}$ and $R_{ZF1}$.

Coarse span adjustment is obtained in a manner similar to the coarse zero offset adjustment described above. Coarse span adjustment is obtained around inverting amplifier IC1B, where input resistor $R_{SI}$ and feedback resistor $R_{SF1}$ are, depending on the span jumper positions, shunted by resistors $R_{S1}$ and/or $R_{S3}$ to a total shunted value respectively of 90% and 70% of initial value.

For example, a nominal gain $G_N$ can be calculated for inverting amplifier IC1B with no jumpers inserted into positions S1, S2 or S3. This gain can be changed $+/-10\%$ by placing S1 jumper in the + or − position respectively. Similarly, jumper S3 can alter the gain by $+/-30\%$.

Obviously, many modifications and variations of the present invention are possible in light of the above teachings. The three jumper blocks illustrated for both the zero and span adjustments can be replaced with another type of switching device without departing from the spirit of the invention. For example, a DIP switch could be used to select the various resistance values for the zero trim adjustment. Alternately, other types of switching mechanisms could be used, such as an automated switching technique to select the zero or span trimming resistance values electronically. Similarly, the zero and span trim resistors, although illustrated here as passive resistive devices could also be constructed from active components in order to integrate the design onto an IC or to allow for active control of the zero offset selection.

It also should be noted that although the resistance values are shown here as arranged in a ration of 1:3:9, other ratios may also be used without departing from the spirit or scope of the invention. For example, a differently weighted series of resistors could be used to alter the range of the zero or span adjustments, or to allow the range to be adjusted in nonuniform incremental steps. Further, it is envisioned, that although 3 jumper blocks are shown here for each of the zero and span adjustments, a greater of fewer number of jumper blocks may be used to provide fewer or greater number of incremental adjustment steps or to alter the effective range of the zero and span adjustments. As an illustrative example, for instance, two jumper blocks could be used with resistors arranged in a 2:1 ratio to provide for 32 or 9 possible combinations of zero or span adjustments with two selectable reference voltages.

Similarly, although the preferred embodiment shown here shows the used of two reference voltages $+V_{ref}$ and $-V_{ref}$, a greater or fewer number of reference voltages may be used to increase or decrease the number of incremental adjustment steps. For example, if only $+V_{ref}$ were used with a combination of three resistance values, there would be a total number of $2^3$ or 8 possible combinations of zero or span adjustments. In the same vein, although reference voltages $+V_{ref}$ and $-V_{ref}$ are shown here as being equal in magnitude and opposite in polarity, is possible to proved any number of reference voltages of same or differing polarities in various relationships to one another.

It is therefore to be understood that within the scope of the appended claims the invention may be practiced otherwise than as specifically described.

What is claimed is:

1. A signal conditioning circuit for amplifying a signal and providing a DC offset to the signal, said signal conditioning circuit comprising:
   an amplifier for providing said DC offset;
   at least three resistors, one end of each of said three resistors coupled to said amplifier, for biasing said amplifier;
   at least three switching means, each of said at least three switching means having at least three terminals, a first terminal of each of said at least three switching means corresponding and coupled to one end of a corresponding one of said at least three resistors; and
   at least two predetermined DC voltage sources, each of said at least two predetermined DC voltage sources corresponding to and coupled to a corresponding other of said at least three terminals of said at least three switching means;
   wherein each of said three switching means may be selectively closed to connect a corresponding one of said three resistors to one of said two predetermined DC voltage sources so as to bias said amplifier to provided a predetermined DC offset.

2. The signal conditioning circuit of claim 1 wherein said at least two predetermined DC voltage sources comprise two DC voltage sources producing voltages which are equal in magnitude and opposite in polarity.

3. The signal conditioning circuit of claim 1 wherein said at least three switching means comprises at least three jumper blocks.

4. A signal conditioning circuit for amplifying a signal and providing a gain to the signal, said signal conditioning circuit comprising:
   an amplifier for providing said gain;
   a first group of at least two resistors, one end of each of said first group of two resistors coupled to the input of said amplifier, for biasing said amplifier;
   a first group of at least two switching means, each of said first group of at least two switching means having at least three terminals, a first terminal of each of said at least two switching means corresponding and coupled to one end of a corresponding one of said first group of at least two resistors a second terminal of each of said at least two switching means coupled to the input of said amplifier and a third terminal of each of said at least two switching means coupled to the output of said amplifier;
   a second group of at least one pair of resistors, one end of one of said at least one pair of resistors coupled to the output of said amplifier and one end of the other of said at least one pair of said resistors coupled to ground, for biasing said amplifier; and
   a second group of at least one switching means, each of said second group of at least one switching means having at least three terminals, a first terminal of each of said at least one switching means coupled to the input of said amplifier, a second terminal of each of said at least one switching means coupled to the other end of one of said at least one pair of resistors and a third terminal of each of said at least one switching means coupled to the other end of the other of said at least one pair of resistors;
   wherein each of said first group of at least two switching means and said second group of at least one switching means may be selectively closed to couple a corresponding one of said first group of at least two resistors or said second group of at least one pair of resistors, respectively to said amplifier so as to bias said amplifier to provided a predetermined gain.

5. The signal conditioning circuit of claim 4 wherein said switching means comprises jumper blocks.

6. A signal conditioning circuit for amplifying a signal and providing both a DC offset and a gain to the signal, said signal conditioning circuit comprising:
a first amplifier for providing said DC offset;
a first group of at least three resistors, one end of each of said first group of three resistors coupled to said amplifier, for biasing said amplifier;
a first group of at least three switching means, each of said first group of at least three switching means having at least three terminals, a first terminal of each of said first group of at least three switching means corresponding and coupled to one end of a corresponding one of said first group of at least three resistors;
at least two predetermined DC voltage sources, each of said at least two predetermined DC voltage sources corresponding to and coupled to a corresponding other of said at least three terminals of said first group of at least three switching means;
a second amplifier, coupled to said first amplifier, for providing said gain;
a second group of at least two resistors, one end of each of said second group of at least two resistors coupled to the input of said second amplifier, for biasing said second amplifier;
a second group of at least two switching means, each of said second group of at least two switching means having at least three terminals, a first terminal of each of said at least two switching means corresponding and coupled to one end of a corresponding one of said second group of at least two resistors a second terminal of each of said at least two switching means coupled to the input of said second amplifier and a third terminal of each of said at least two switching means coupled to the output of said second amplifier;
a third group of at least one pair of resistors, one end of one of said at least one pair of resistors coupled to the output of said second amplifier and one end of the other of said at least one pair of said resistors coupled to ground, for biasing said amplifier; and
a third group of at least one switching means, each of said third group of at least one switching means having at least three terminals, a first terminal of each of said at least one switching means coupled to the input of said second amplifier, a second terminal of each of said at least one switching means coupled to the other end of one of said one pair of resistors and a third terminal of each of said at least one switching means coupled to the other end of the other of said at least one pair of resistors;
wherein each of said first group of at least three switching means may be selectively closed to connect a corresponding one of said first group of at least three resistors to one of said at least two predetermined DC voltage sources so as to bias said first amplifier to provided a predetermined DC offset and each of said second group of at least two switching means and said third group of at least one switching means may be selectively closed to couple a corresponding one of said second group of at least two resistors or said third group of at least one pair of resistors, respectively to said second amplifier so as to bias said second amplifier to provided a predetermined gain.

7. The signal conditioning circuit of claim 6 wherein said switching means comprises jumper blocks.

8. The signal conditioning circuit of claim 6 wherein said second group of at least two resistors comprises two resistors, said third group of at least one pair of resistors comprises one pair of resistors, said second group of at least two switching means comprises two switching means, and said third group of at least one switching means comprises one switching means.

9. The signal conditioning circuit of claim 8, wherein said two resistors comprises a first resistor having a first resistance value and a second resistor having a second resistance value three times that of said first resistance value, and each of said one pair of resistors has a value three times that of said second resistance value.

10. The signal conditioning circuit of claim 6, wherein said switching means comprises jumper blocks.

* * * * *